(12) United States Patent
Lee (10) Patent No.: US 8,637,988 B2
(45) Date of Patent: Jan. 28, 2014

(54) SEMICONDUCTOR DEVICE AND METHOD OF TESTING THE SAME

(75) Inventor: Jong-Hyun Lee, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 13/525,707

(22) Filed: Jun. 18, 2012

(65) Prior Publication Data

US 2013/0119554 A1 May 16, 2013

(30) Foreign Application Priority Data

Nov. 14, 2011 (KR) .......................... 10-2011-0118439

(51) Int. Cl.
*H01L 23/48* (2006.01)
*H01L 23/52* (2006.01)
*H01L 29/40* (2006.01)

(52) U.S. Cl.
USPC ........................................................ 257/758

(58) Field of Classification Search
USPC ................................... 257/202, 204, 206–21
See application file for complete search history.

(56) References Cited

U.S. PATENT DOCUMENTS 7,395,518 B2 7/2008 Ciplickas et al.
2009/0249610 A1* 10/2009 Ding et al. ...................... 29/600

FOREIGN PATENT DOCUMENTS

JP 2006059895 A 3/2006
KR 20100013935 A 2/2010

* cited by examiner

*Primary Examiner* — Steven Loke
*Assistant Examiner* — Juanita B Rhodes
(74) *Attorney, Agent, or Firm* — Harness, Dickey & Pierce, P.L.C.

(57) ABSTRACT

There is provided a semiconductor device comprising, a first metal pattern formed at a first metal level and extending in a first direction, a second metal pattern formed at the first metal level, extending in a second direction that is different than the first direction, and disposed on a side of the first metal pattern to be separated from the first metal pattern, a first via structure formed on the first metal pattern, a third metal pattern formed at a second metal level that is different than the first metal level and electrically connected to the first metal pattern by the first via structure, and a first pad electrically connected to the first metal pattern and a second pad electrically connected to the third metal pattern.

19 Claims, 9 Drawing Sheets

SEMICONDUCTOR DEVICE AND METHOD OF TESTING THE SAME

This application claims priority from Korean Patent Application No. 10-2011-0118439 filed on Nov. 14, 2011 in the Korean Intellectual Property Office, the disclosure of which is incorporated herein by reference in its entirety.

BACKGROUND

1. Field of the Invention

The present disclosure relates to a semiconductor device and a method of testing the same.

2. Description of the Related Art

A semiconductor backend process includes a metal wiring process and a via process. That is, a via is formed to connect a metal wiring and another metal wiring which is to be formed on the metal wiring.

Various problems (such as impurity introduction and processing errors) that occur during the metal wiring process and the via process may cause lower metal wirings to short-circuit, metal wirings to be cut, or lower and upper metal wirings to be connected incorrectly. These defects reduce the semiconductor manufacturing yield and increase manufacturing costs.

SUMMARY

Some aspects of the present disclosure provide a semiconductor device whose defects can be detected quickly and accurately.

Some aspects of the present disclosure also provide a method of testing a semiconductor device whose defects can be detected quickly and accurately.

However, aspects of the present disclosure are not restricted to the ones set forth herein. The above and other aspects of the present disclosure will become more apparent to one of ordinary skill in the art to which the present disclosure pertains by referencing the detailed description of the present disclosure given below.

According to one example embodiment, there is provided a semiconductor device comprising, a first metal pattern formed at a first metal level and configured to extend in a first direction, a second metal pattern formed at the first metal level, and configured to extend in a second direction, the second direction being different than the first direction, and the second metal pattern being disposed at a side of the first metal pattern to be separated from the first metal pattern, a first via structure formed on the first metal pattern, a third metal pattern formed at a second metal level that is different than the first metal level, and the third metal pattern being electrically connected to the first metal pattern by the first via structure, a first pad electrically connected to the first metal pattern; and a second pad electrically connected to the third metal pattern.

According to another example embodiment, there is provided a semiconductor device comprising, first and second sets of metal patterns neighboring each other and each including a first metal pattern formed at a first metal level and configured to extend in a first direction, a fifth metal pattern formed at the first metal level and configured to extend in a second direction between the first set and the second set, and a third metal pattern not electrically connected to the fifth metal pattern and configured to traverse the fifth metal pattern to electrically connect the first metal pattern of the first set and the first metal pattern of the second set.

According to another example embodiment, there is provided a semiconductor device comprising a first set of metal patterns including a first metal pattern formed at a first level, a second metal pattern formed at a second level, the second metal pattern being electrically connected the first metal pattern by a first via structure a first pad electrically connected to the first metal pattern, and a second pad electrically connected to the second metal pattern.

BRIEF DESCRIPTION OF THE DRAWINGS

The above and other aspects and features of the present disclosure will become more apparent by describing in detail exemplary embodiments thereof with reference to the attached drawings, in which:

FIGS. 3 and 4 are cross-sectional views taken along the line A-A' of FIG. 1. Specifically, FIG. 3 illustrates a case where the semiconductor device is non-defective. FIG. 4 illustrates a case where the semiconductor device is defective.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF THE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Semiconductor devices according to some example embodiments of the present invention may be test patterns used to determine whether a metal pattern is defective.

Figure 1:
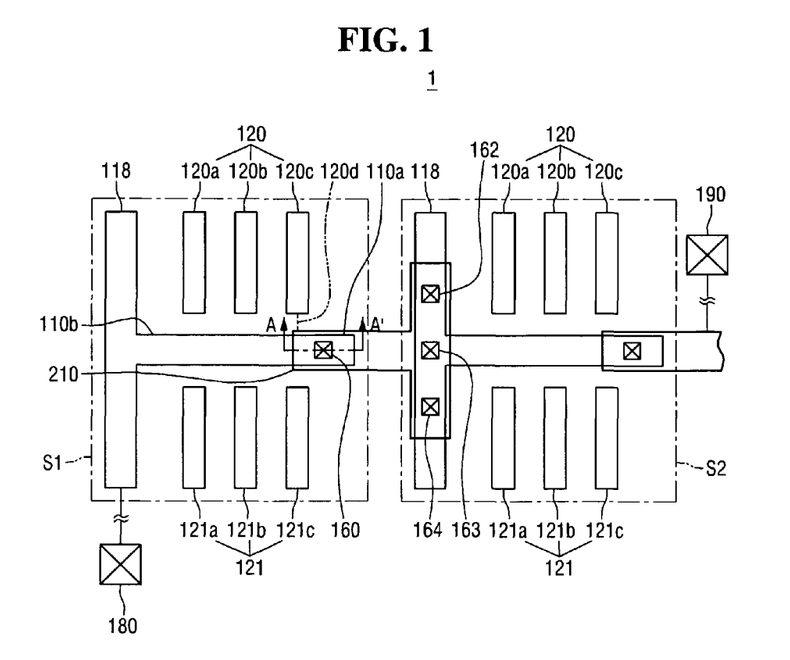
FIG. 1 is a layout diagram of a semiconductor device according to an example embodiment.
Figure 2:
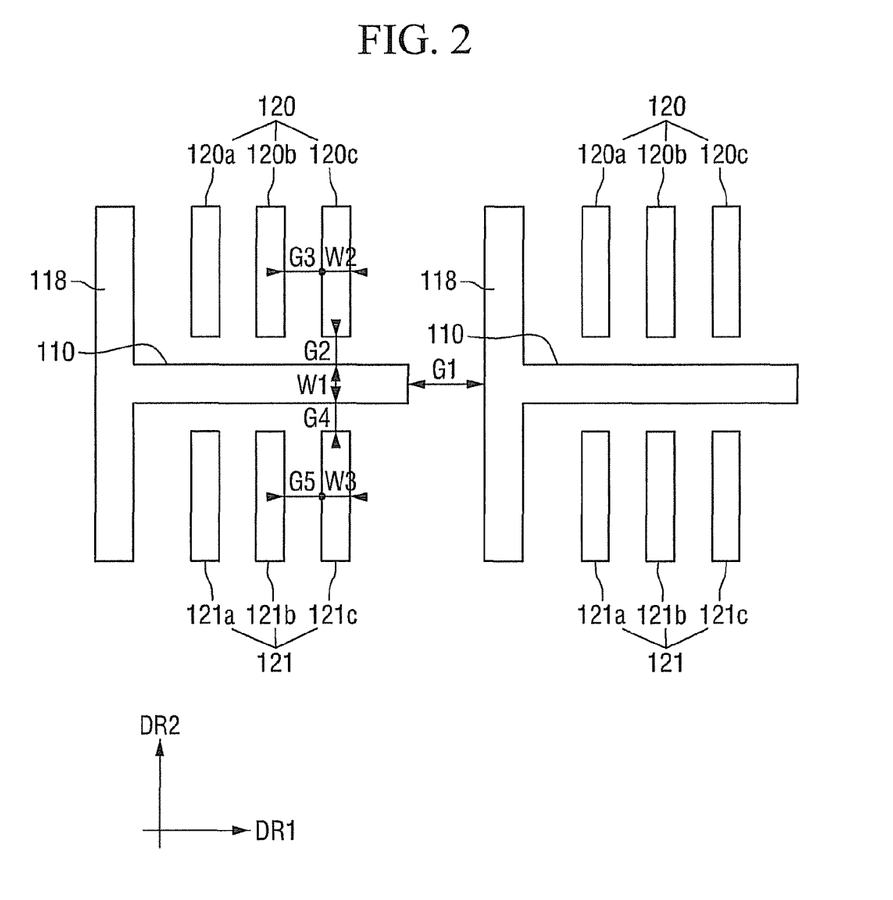
FIG. 2 is a layout diagram excluding a third metal pattern from FIG. 1.
Figure 3:
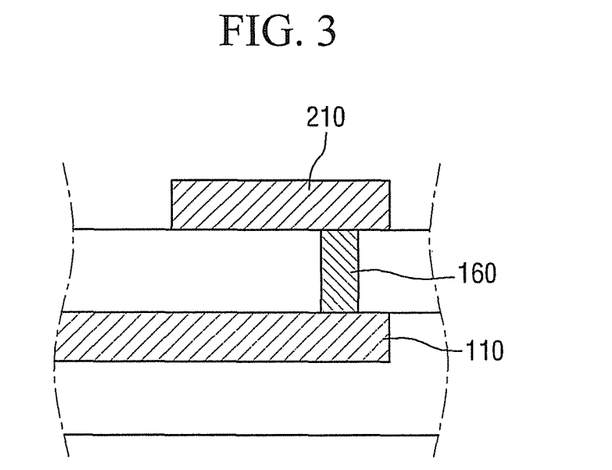
Figure 4:
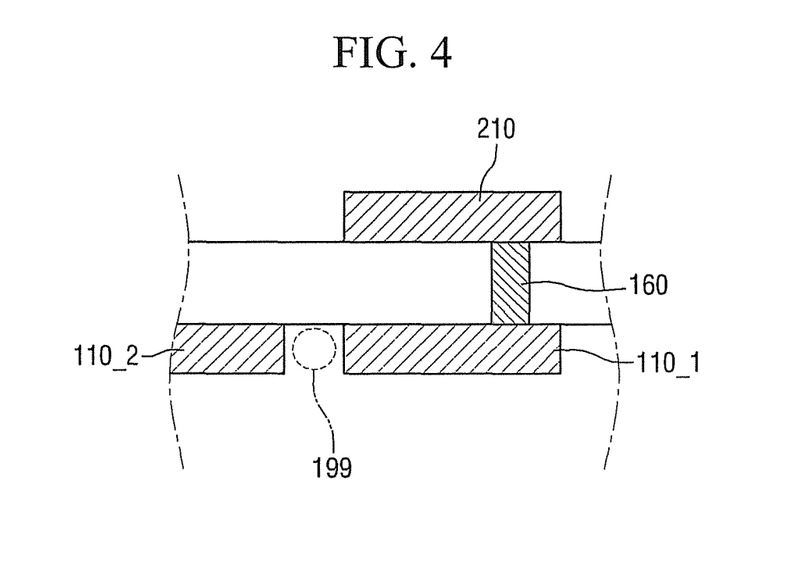

FIG. 1 is a layout diagram of a semiconductor device according to an example embodiment. FIG. 2 is a layout diagram excluding a third metal pattern from FIG. 1. FIGS. 3 and 4 are cross-sectional views taken along the line A-A' of FIG. 1. Specifically, FIG. 3 illustrates a case where the semiconductor device according to an example embodiment is non-defective. FIG. 4 illustrates a case where the semiconductor device is defective.

Referring to FIGS. 1 and 2, the semiconductor device 1 may include a plurality of sets S1 and S2 that neighbor each other. For ease of description, only two sets of metal patterns, that is, a first set S1 and a second set S2 are illustrated in the drawings.

The semiconductor device 1 includes a first metal pattern 110, a second metal pattern 120, a third metal pattern 210, a fourth metal pattern 118, a fifth metal pattern 121, a first via structure 160, a second via structure 162 through 164, a first pad 180, a second pad 190, and the like. Here, each set S1 or S2 may include the first metal pattern 110, the second metal pattern 120, the fourth metal pattern 118, and the fifth metal pattern 121.

The first metal pattern 110, the second metal pattern 120, the fourth metal pattern 118, and the fifth metal pattern 121 may be formed at a first metal level, and the third metal pattern 210 may be formed at a second metal level that is different than the first metal level. The second metal level may be, but is not limited to, higher than the first metal level.

The first metal pattern 110 may extend in a first direction DR1.

The fourth metal pattern 118 may branch from the first metal pattern 110 and extend in a second direction DR2, which is different than the first direction DR1. The first direction DR1 and the second direction DR2 may be, but are not limited to, perpendicular to each other. As shown in the drawings, the first metal pattern 110 and the fourth metal pattern 118 may form a 'T' shape.

The second metal pattern 120 may extend in the second direction DR2. In addition, the second metal pattern 120 may be separated from the first metal pattern 110 and disposed on a side (e.g., an upper side) of the first metal pattern 110. As shown in the drawings, the second metal pattern 120 may include, but not limited to, three separate patterns 120a through 120c.

The fifth metal pattern 121 may extend in the second direction DR2. In addition, the fifth metal pattern 121 may be separated from the first metal pattern 110 and disposed on the other side (e.g., a lower side) of the first metal pattern 110. As shown in the drawings, the fifth metal pattern 121 may include, but not limited to, three separate patterns 121a through 121c.

The first via structure 160 may be disposed on the first metal pattern 110, and the second via structure 162 through 164 may be disposed on the fourth metal pattern 118.

The third metal pattern 210 may be electrically connected to the first metal pattern 110 of the first set S1 by the first via structure 160 and to the fourth metal pattern 118 of the second set S2 by the second via structure 162 through 164. Consequently, the third metal pattern 210 may electrically connect the first metal pattern 110 of the first set S1 and the first metal pattern 110 of the second set S2.

The second via structure 162 through 164 may include a plurality of (e.g., three) vias 162 through 164. A greater number of vias may allow the fourth metal pattern 118 of the second set S2 to be connected to the third metal pattern 210 in a more stable manner. Even if any one (e.g., 162) of the vias 162 through 164 is misaligned, the fourth metal pattern 118 of the second set S2 may be electrically connected to the third metal pattern 210 by the other vias (e.g., 163 and 164).

The first pad 180 may be electrically connected to the first metal pattern 110, and the second pad 190 may be electrically connected to the third metal pattern 210. Whether the first metal pattern 110 is defective may be tested by transmitting electrical signals to the first pad 180 and the second pad 190. This test method will be described later.

When the semiconductor device 1 according to an example embodiment is non-defective, it may be formed as shown in FIG. 3. That is, the first metal pattern 110 is not cut.

On the other hand, when the semiconductor device 1 is defective, it may be formed as shown in FIG. 4. That is, the first metal pattern 110 may be divided into a first pattern 110_1 and a second pattern 110_2 (see reference numeral 199). The first metal pattern 110 may be cut due to manufacturing or design problems.

The cutting of the first metal pattern 110 may be depend on a width W1 of the first metal pattern 110, a width W2 of the second metal pattern 120, a width W3 of the fifth metal pattern 121, a gap G1 between the first metal pattern 110 of the first set S1 and the fourth metal pattern 118 of the second set S2, a gap G2 between the first metal pattern 110 and the second metal pattern 120, a gap G3 between the patterns 120a through 120c of the second metal pattern 120, a gap G4 between the patterns 120a through 120c and the first metal pattern 110 and a gap G5 between the patterns 121a through 121c of the fifth metal pattern 121.

For example, when the gap G1 between the first metal pattern 110 of the first set S1 and the fourth metal pattern 118 of the second set S2 is small, the first metal pattern 110 of the first set S1 may be cut due to the effect of the fourth metal pattern 118 of the second set S2.

In another example, when the gap G2 between the first metal pattern 110 and the second metal pattern 120 is small (e.g., a minimum design rule), the first metal pattern 110 may be cut due to the effect of the second metal pattern 120. That is, the first metal pattern 110 may be cut in a region in which an extension line 120d of a second metal pattern (e.g., 120c) meets the first metal pattern 110.

Here, the extension line 120d of the second metal pattern (e.g., 120c) may divide the first metal pattern 110 into a first portion 110a and a second portion 110b, where the first portion 110a may be closer to the fourth metal pattern 118 than the second portion 110b. In this case, the first via structure 160 may include at least one via which contacts the first portion 110a. An electric current may not flow through the first metal pattern 110 when the first metal pattern 110 is divided into the first portion 110a and the second portion 110b (i.e., when first metal pattern 110 is cut).

When necessary (that is, for testing purpose), the width W1 of the first metal pattern 110, the width W2 of the second metal pattern 120, the width W3 of the fifth metal pattern 121, the gap G1 between the first metal pattern 110 of the first set S1 and the fourth metal pattern 118 of the second set S2, the gap G2 between the first metal pattern 110 and the second metal pattern 120, the gap G3 between the patterns 120a through 120c of the second metal pattern 120, and the gap G5 between the patterns 121a through 121c of the fifth metal pattern 121 may be adjusted. For example, the gap G1 between the first metal pattern 110 of the first set S1 and the fourth metal pattern 118 of the second set S2 may be adjusted to be greater than the gap G2 between the first metal pattern 110 and the second metal pattern 120. Therefore, the effects of the gaps G1 and G2 can be evaluated.

When the semiconductor device 1 is used, defects can be detected accurately and quickly.

That is, when an electric current flows between the first pad 180 and the second pad 190 after electrical signals are transmitted to the first pad 180 and the second pad 190, it may be determined that the semiconductor device 1 is non-defective. Conversely, when no electric current flows between the first pad 180 and the second pad 190 even after electrical signals are transmitted to the first pad 180 and the second pad 190, it may be determined that the semiconductor device 1 is defective.

Almost all kinds of defects can be found through optical inspection. However, optical inspection cannot sort out major defects that directly cause a reduction in yield. Furthermore, since equipment used in optical inspection inspects a semiconductor wafer by scanning the semiconductor wafer, a lot of time is required. Therefore, not all semiconductor wafers can be optically inspected when a product is produced. In addition, if optical inspection is performed only on a certain region of a semiconductor wafer, not all defects can be detected, which, in turn, limits an improvement in the manufacturing yield. On the other hand, when the semiconductor device 1 is used, defects can be detected accurately and quickly. This enables a significant improvement in yield.

Figure 5:
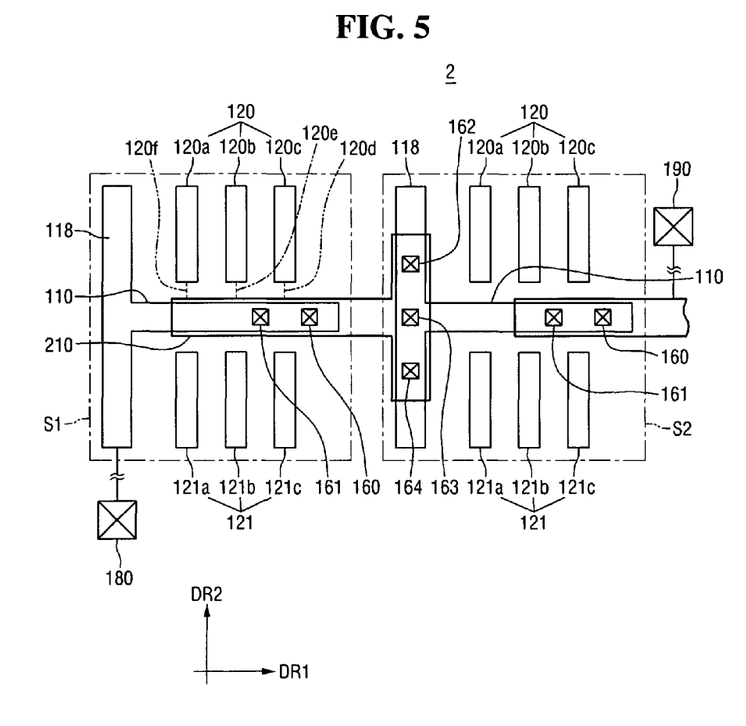
FIG. 5 is a layout diagram of a semiconductor device according to an example embodiment.

FIG. 5 is a layout diagram of a semiconductor device according to an example embodiment.

Referring to FIG. 5, the semiconductor device 2 is different than the semiconductor device 1 in that first via structures 160 and 161 include a plurality of vias. In this case, a first metal pattern 110 and a third metal pattern 210 can be connected to each other in a stable manner. In addition, if a first metal pattern 110 is cut in a region in which an extension line 120f of a second metal pattern (e.g., 120a) meets the first metal pattern 110 or a region in which an extension line 120e of a second metal pattern (e.g., 120b) meets the first metal pattern 110, no electric current flows between a first pad 180 and a second pad 190.

Figure 6:
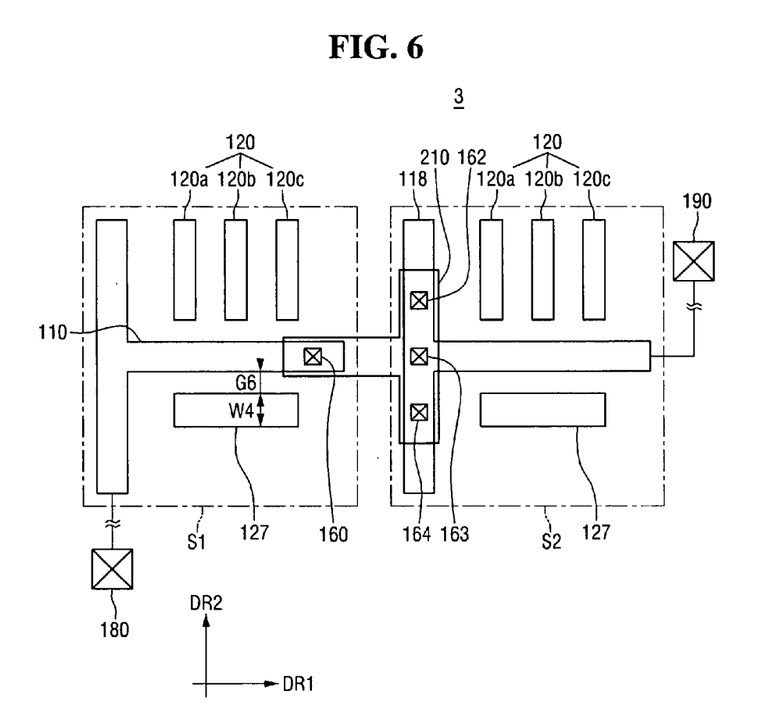
FIG. 6 is a layout diagram of a semiconductor device according to an example embodiment.

FIG. 6 is a layout diagram of a semiconductor device according to an example embodiment.

Referring to FIG. 6, the semiconductor device 3 is different than the semiconductor device 1 in that it includes a sixth metal pattern 127 instead of a fifth metal pattern 121. The sixth metal pattern 127 may be formed at a first metal level and extend in a first direction DR1. In addition, the sixth metal pattern 127 may be disposed on a side of a first metal pattern 110 that may be separated from the first metal pattern 110. For example, a width W4 of the sixth metal pattern 127 and a gap G6 between the sixth metal pattern 127 and the first metal pattern 110 may cause defects in the first metal pattern 110.

Figure 7:
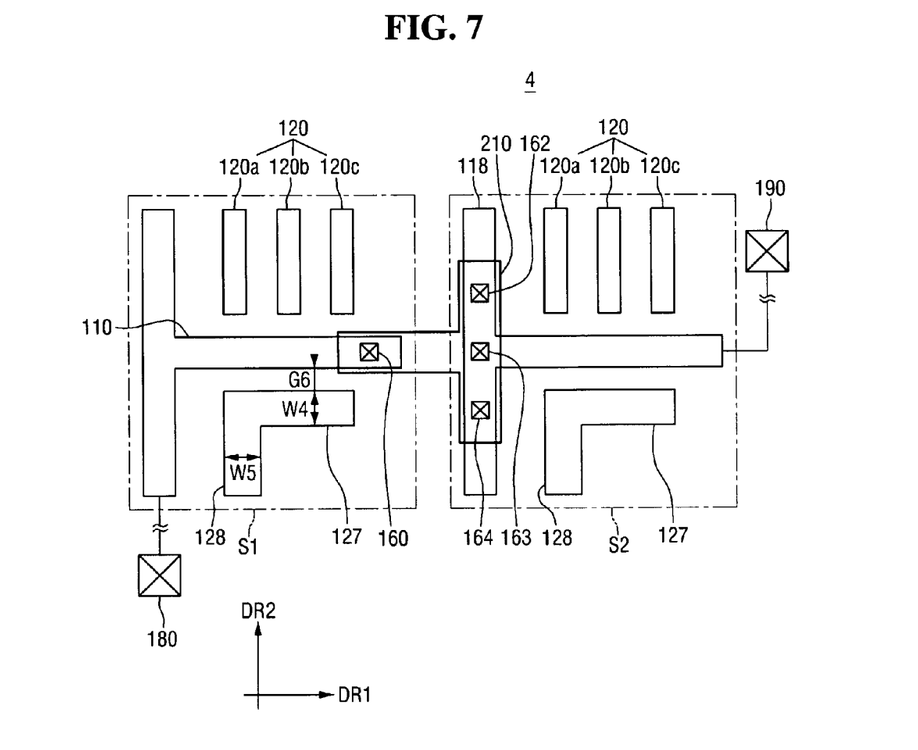
FIG. 7 is a layout diagram of a semiconductor device according to an example embodiment.

FIG. 7 is a layout diagram of a semiconductor device according to an example embodiment.

Referring to FIG. 7, the semiconductor device 4 is different than the semiconductor device 1 in that it includes a sixth metal pattern 127 and an eighth metal pattern 128 instead of a fifth metal pattern 121. The eighth metal pattern 128 may branch from the sixth metal pattern 127 and extend in a second direction DR2. Therefore, as shown in the drawing, the sixth metal pattern 127 and the eighth metal pattern 128 may form a '⌐' shape (i.e., L shape). However, the present disclosure is not limited thereto. The sixth metal pattern 127 and the eighth metal pattern 128 may also form a 'T' shape.

For example, a width W4 of the sixth metal pattern 127, a width W5 of the eighth metal pattern 128 and a gap G6 between the sixth metal pattern 127 and a first metal pattern 110 may cause defects in the first metal pattern 110.

Figure 8:
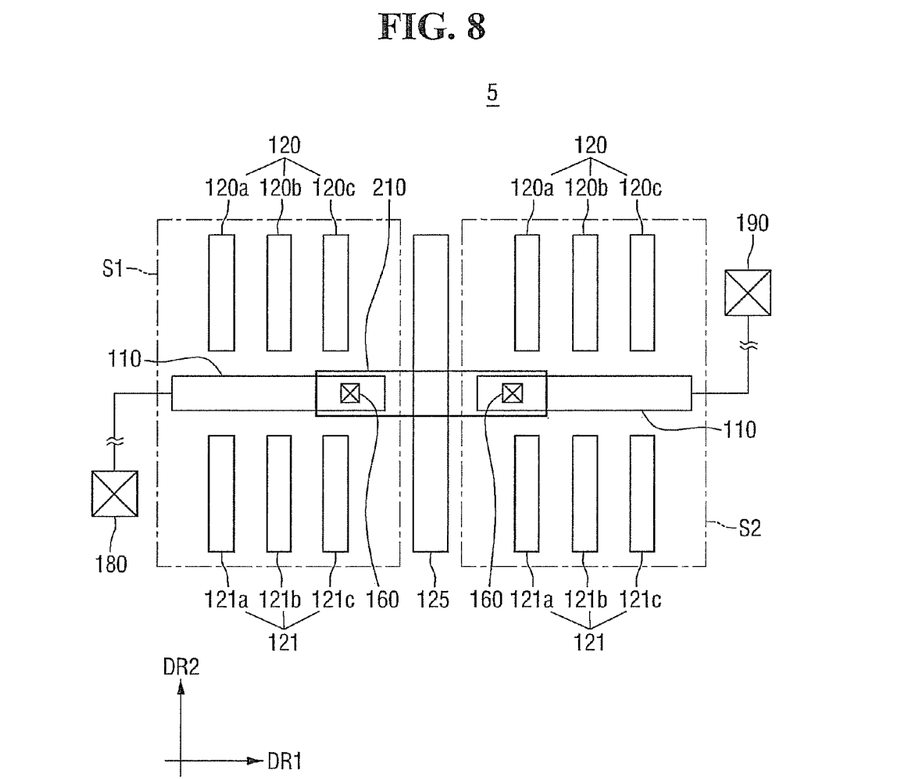
FIG. 8 is a layout diagram of a semiconductor device according to an example embodiment.

FIG. 8 is a layout diagram of a semiconductor device according to an example embodiment.

Referring to FIG. 8, a seventh metal pattern 125 of the semiconductor device 5 may extend in a second direction DR2 between a first set S1 and a second set S2. That is, the seventh metal pattern 125 may separate the first set S1 from the second set S2.

A third metal pattern 210 may not be electrically connected to the seventh metal pattern 125 and may traverse the seventh metal pattern 125 to electrically connect a first metal pattern 110 of the first set S1 and a first metal pattern 110 of the second set S2.

Figure 9:
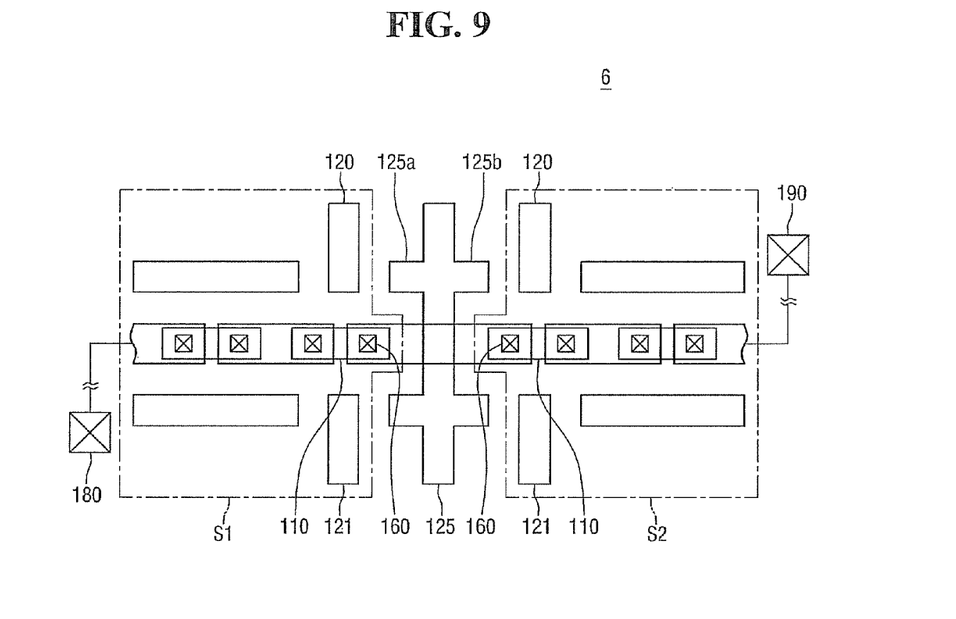
FIG. 9 is a layout diagram of a semiconductor device according to an example embodiment.

FIG. 9 is a layout diagram of a semiconductor device according to an example embodiment.

Referring to FIG. 9, a seventh metal pattern 125 of the semiconductor device 6 may include '┌' shapes (i.e., bracket shapes) 125a and 125b which are open toward a first metal pattern 110 of a first set S1 (to the left of the drawing) and toward a first metal pattern 110 of a second set S2 (e.g., to the right of the drawing). Although not shown in the drawing, the seventh metal pattern 125 may include only the '┌' shape 125a which is open toward the first metal pattern 110 of the first set S1. Alternatively, the seventh metal pattern 125 may include only the '┐' shape 125b which is open toward the first metal pattern 110 of the second set S2.

A third metal pattern 210 may not be electrically connected to the seventh metal pattern 125 and may traverse the seventh metal pattern 125 to electrically connect the first metal pattern 110 of the first set S1 and the first metal pattern 110 of the second set S2.

Figure 10:
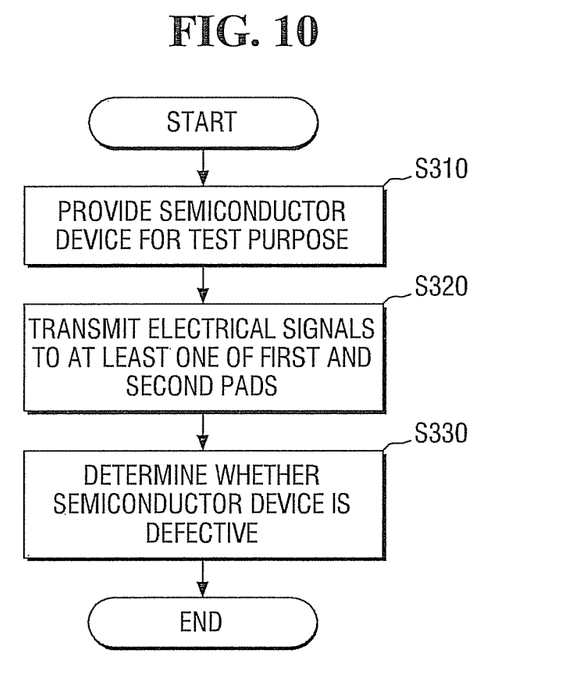
FIG. 10 is a flowchart illustrating a test method according to an example embodiment.

FIG. 10 is a flowchart illustrating a test method according to an example embodiment.

Referring to FIG. 10, a semiconductor device according to an example embodiment (e.g., the semiconductor device 1) is provided (operation S310). As described above, the semiconductor device 1 may include the first metal pattern 110 which is formed at the first metal level and extends in the first direction DR1, the second metal pattern 120 which is formed at the first metal level, extends in the second direction DR2 different than the first direction DR1 and disposed on a side of the first metal pattern 110 to be separated from the first metal pattern 110, the first via structure 160 which is formed on the first metal pattern 110, the third metal pattern 210 which is formed at the second metal level different than the first metal level and electrically connected to the first metal pattern 110 by the first via structure 160, the first pad 180 which is electrically connected to the first metal pattern 110, and the second pad 190 which is electrically connected to the third metal pattern 210.

Next, an electrical signal is transmitted to at least one of the first pad 180 and the second pad 190 (operation S320).

Then, it may be determined whether the first metal pattern 110 is defective (operation S330). Specifically, the amount of electric current flowing between the first pad 180 and the second pad 190 is measured, and whether the first metal pattern 110 is defective is determined based on the measurement result. For example, when no electric current flows between the first pad 180 and the second pad 190, it is determined that the semiconductor device 1 is defective. When an electric current flows between the first pad 180 and the second pad 190, it is determined that the semiconductor device 1 is non-defective.

While example embodiments have been particularly shown and described, it will be understood by one of ordinary skill in the art that variations in form and detail may be made therein without departing from the spirit and scope of the claims.

What is claimed is:

1. A semiconductor device comprising:
    a first metal pattern formed at a first metal level and configured to extend in a first direction;
    a second metal pattern formed at the first metal level and configured to extend in a second direction, the second direction being different than the first direction, and the second metal pattern being disposed at a side of the first metal pattern to be separated from the first metal pattern;
    a first via structure formed on the first metal pattern;
    a third metal pattern formed at a second metal level that is different than the first metal level, and the third metal pattern being electrically connected to the first metal pattern by the first via structure;
    a first pad electrically connected to the first metal pattern; and
    a second pad electrically connected to the third metal pattern,
    wherein the first pad, the first metal pattern, the first via structure, the third metal pattern, and the second pad do not form a closed current path.

2. The semiconductor device of claim 1, further comprising:
    a first and a second set of metal patterns configured to neighbor each other, wherein the first set of metal patterns includes the first metal pattern and the second metal pattern, and
    the second set of metal patterns includes a fourth metal pattern and a fifth metal pattern, the fourth metal pattern formed at the first metal level and configured to extend in the first direction, the fifth metal pattern formed at the first metal level and configured to extend in the second direction, and the fifth metal pattern being disposed at a side of the fourth metal pattern to be separated from the fourth metal pattern.

3. The semiconductor device of claim 2, wherein the third metal pattern is electrically connected to the first metal pattern of the first set and the fourth metal pattern of the second set.

4. The semiconductor device of claim 2, wherein
    the first set and the second set further include a sixth and a seventh metal pattern, respectively, formed at the first metal level, configured to branch from the first and the fourth metal patterns, respectively, and extend in the second direction, and the third metal pattern is connected to the first metal pattern of the first set by the first via structure and is connected to the seventh metal pattern of the second set by a second via structure.

5. The semiconductor device of claim 4, wherein a gap between the first metal pattern of the first set and the seventh metal pattern of the second set is greater than a gap between the first metal pattern of the first set and the second metal pattern of the first set.

6. The semiconductor device of claim 4, wherein the first metal pattern of the first set is divided into a first portion and a second portion by an extension line of the second metal pattern, and the first via structure comprises at least one via configured to contact the first portion, wherein the first portion is closer to the seventh metal pattern of the second set than the second portion.

7. The semiconductor device of claim 2, further comprising:

a sixth metal pattern formed at the first metal level and configured to extend in the second direction between the first set and the second set.

8. The semiconductor device of claim 7, wherein the third metal pattern is not electrically connected to the sixth metal pattern and is configured to traverse the sixth metal pattern to electrically connect the first metal pattern of the first set and the fourth metal pattern of the second set.

9. The semiconductor device of claim 7, wherein the sixth metal pattern is configured as a '⊏' shape that is open toward the first metal pattern of the first set or the fourth metal pattern of the second set.

10. The semiconductor device of claim 7, wherein the first metal pattern is divided into a first portion and a second portion by an extension line of the second metal pattern, and the first via structure includes at least one via configured to contact the first portion, wherein the first portion is closer to the sixth metal pattern than the second portion.

11. The semiconductor device of claim 1, further comprising:
a fourth metal pattern formed at the first metal level, configured to extend in the second direction, and disposed on an other side of the first metal pattern to be separated from the first metal pattern.

12. The semiconductor device of claim 1, further comprising:
a fourth metal pattern formed at the first metal level, configured to extend in the first direction, and disposed on an other side of the first metal pattern to be separated from the first metal pattern.

13. The semiconductor device of claim 12, further comprising:
a fifth metal pattern configured to branch from the fourth metal pattern and extend in the second direction.

14. A semiconductor device comprising:
first and second sets of metal patterns neighboring each other and each including a first metal pattern formed at a first metal level and configured to extend in a first direction;
a second metal pattern formed at the first metal level and configured to extend in a second direction between the first set and the second set; and
a third metal pattern not electrically connected to the second metal pattern and configured to traverse the second metal pattern to electrically connect the first metal pattern of the first set and the first metal pattern of the second set,
wherein the second metal pattern is configured as a '⊏' shape that is open toward the first metal pattern of the first set or the first metal pattern of the second set.

15. A semiconductor device comprising:
a first set of metal patterns including a first metal pattern formed at a first level;
a second metal pattern formed at a second level, the second metal pattern being electrically connected the first metal pattern by a first via structure;
a first pad electrically connected to the first metal pattern; and
a second pad electrically connected to the second metal pattern,
wherein the first pad, the first metal pattern, the first via structure, the second metal pattern, and the second pad do not form a closed current path.

16. The semiconductor device of claim 15, further comprising a second set of metal patterns including a third metal pattern formed at the first level, wherein the second metal pattern is electrically connected to the third metal pattern by a second via structure.

17. The semiconductor device of claim 16, wherein
the first set of metal patterns includes a fourth metal pattern formed at the first level,
the first metal pattern is configured to extend in a first direction, and the fourth metal pattern is configured to extend in a second direction, and
the fourth metal pattern is disposed on a side of the first metal pattern and separate from the first metal pattern.

18. The semiconductor device of claim 16, further comprising:
a fourth metal pattern formed at the first level, wherein the second metal pattern is not electrically connected to the fourth metal pattern, and the second metal pattern is configured to traverse the fourth metal pattern.

19. The semiconductor device of claim 18, wherein the fourth metal pattern is configured as at least one of an L-shape and a bracket shape.

* * * * *